(12) United States Patent
Navarro et al.

(10) Patent No.: US 10,547,002 B2
(45) Date of Patent: Jan. 28, 2020

(54) METHOD FOR MANUFACTURING A RESISTIVE RANDOM ACCESS MEMORY; HAVING REDUCED VARIABILITY OF ELECTRICAL CHARACTERISTICS

(71) Applicant: COMMISSARIAT A L'ENERGIE ATOMIQUE ET AUX ENERGIES ALTERNATIVES, Paris (FR)

(72) Inventors: Gabriele Navarro, Grenoble (FR); Christelle Charpin-Nicolle, Fontanil-Cornillon (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 194 days.

(21) Appl. No.: 15/481,653

(22) Filed: Apr. 7, 2017

(65) Prior Publication Data

US 2017/0294580 A1 Oct. 12, 2017

(30) Foreign Application Priority Data

Apr. 8, 2016 (FR) ...................................... 16 53138

(51) Int. Cl.
*H01L 45/00* (2006.01)
*G11C 13/00* (2006.01)

(52) U.S. Cl.
CPC ...... *H01L 45/1608* (2013.01); *G11C 13/0007* (2013.01); *G11C 13/0011* (2013.01);
(Continued)

(58) Field of Classification Search
CPC ............ G11C 13/0007; G11C 13/0011; G11C 13/0069; H01L 27/2472; H01L 45/08;
(Continued)

(56) References Cited

U.S. PATENT DOCUMENTS

| 7,785,920 B2 * | 8/2010 | Lung ...................... H01L 45/06 257/E21.014 |
| 2004/0226686 A1 * | 11/2004 | Maeda .................... F24F 3/001 165/59 |

(Continued)

OTHER PUBLICATIONS

Preliminary Search Report as issued in French Patent Application No. 1653138, dated Dec. 14, 2016.

*Primary Examiner* — Duy T Nguyen
(74) *Attorney, Agent, or Firm* — Pillsbury Winthrop Shaw Pittman LLP

(57) ABSTRACT

A method for manufacturing resistive random access memories, each resistive random access memory including first and second electrodes separated by a layer of active material, the method including producing connector elements with a step Cp along a first direction, each connector element having a width Cb along the first direction; producing a plurality of first electrodes with a step Ep along the first direction, each first electrode having a first end surface and a second end surface, the second end surface having a width Eb along the first direction and an area greater than the area of the first end surface; wherein:
0<Ep−Eb≤Cp−Cb and: Eb<Cp−Cb such that, for each connector element, a first electrode is in contact, via its second end surface, with the connector element, and each first electrode is only in contact, via its second end surface, with at the most one connector element.

7 Claims, 7 Drawing Sheets

(52) U.S. Cl.
CPC ...... *G11C 13/0069* (2013.01); *H01L 45/1633* (2013.01); *H01L 45/1641* (2013.01); *H01L 45/1675* (2013.01)

(58) Field of Classification Search
CPC ............. H01L 45/1233; H01L 45/1253; H01L 45/1273; H01L 45/146; H01L 45/16; H01L 45/1608; H01L 45/1633; H01L 45/1641; H01L 45/1675
See application file for complete search history.

(56) References Cited

U.S. PATENT DOCUMENTS

| | | | |
|---|---|---|---|
| 2009/0261313 A1 | 10/2009 | Lung et al. | |
| 2010/0084741 A1 | 4/2010 | Andres et al. | |
| 2012/0088347 A1* | 4/2012 | Choi | H01L 45/06 438/381 |
| 2013/0170154 A1* | 7/2013 | Lee | H05K 3/32 361/748 |
| 2013/0248799 A1* | 9/2013 | Song | H01L 45/12 257/2 |
| 2014/0021432 A1* | 1/2014 | Lee | H01L 45/04 257/4 |
| 2015/0236256 A1* | 8/2015 | Walls | H01L 45/1273 257/3 |

* cited by examiner

METHOD FOR MANUFACTURING A RESISTIVE RANDOM ACCESS MEMORY; HAVING REDUCED VARIABILITY OF ELECTRICAL CHARACTERISTICS

CROSS REFERENCES TO RELATED APPLICATIONS

This application claims priority to French Patent Application No. 1653138, filed Apr. 8, 2016, the entire content of which is incorporated herein by reference in its entirety.

FIELD

The technical field of the invention is that of non-volatile rewritable memories, and more specifically that of resistive random access memories of OxRRAM and CBRAM type. The present invention in particular relates to a resistive random access memory, a method for manufacturing a resistive random access memory, a method for manufacturing a plurality of resistive random access memories and a method for programming a resistive random access memory.

BACKGROUND

Resistive random access memories, or RRAM, are studied within the scope of non-volatile applications; they notably represent an alternative to the use of flash memories.

A resistive random access memory comprises first and second electrodes separated by a layer of active material. In the initial state, the active material is insulating (PRS, "Pristine Resistance State"). A first electrical stress is applied to the virgin resistive random access memory in order to generate for the first time a LRS (Low Resistance State). The associated process is called FORMING. The resistive random access memory may next switch from the low resistance state LRS to a high resistance state HRS by the application of a first voltage VRESET between the first and second electrodes, and switch from the high resistance state HRS to the low resistance state LRS by the application of a second voltage VSET between the first and second electrodes. It may thus be used to store binary information. The low resistance state LRS is also called "ON" state, The high resistance state HRS is also called "OFF" state.

The phenomenon of change of resistance is observed in different types of materials, which suggests different operating mechanisms. Several types of resistive random access memories may thus be distinguished. The field of the present invention more particularly relates to two categories of resistive random access memories:
- memories comprising an active zone based on an active material based on oxide (OxRRAM or "Oxide RRAM") such as a binary oxide of a transition metal;
- memories comprising an active zone based on an ionic conduction material (CBRAM or "Conductive Bridging RAM") forming a solid electrolyte with ionic conduction arranged between an electrode forming an inert cathode and an electrode comprising a portion of ionisable metal, that is to say a portion of metal that can easily form metal ions, and forming an anode.

The change in resistive state in a resistive random access memory of OxRRAM type is generally explained by the formation of a filament of oxygen vacancies within the active zone. The change of resistive state in a resistive random access memory of CBRAM type is generally explained by the formation of a conductive filament within the active zone.

From the architectural viewpoint, a resistive random access memory is generally associated with a selection device, which may for example be a transistor or a diode. Within an array comprising a plurality of resistive random access memories, a selection device is thus provided for each resistive random access memory. Each resistive random access memory may be connected to its selection device by a connector element such as a via or interconnection hole. It then involves aligning each resistive random access memory with such a connector element. The quality of the alignment typically depends on the performances of the lithography equipment used. It is a parameter that can have an impact on the variability of the devices obtained. It is thus a potentially constraining parameter within the scope of an industrial integration. FIG. 1 shows schematically a resistive random access memory 1 comprising a first electrode E1, a second electrode E2 and a layer of active material A laid out between the first and second electrodes. The first electrode E1 of the resistive random access memory 1 is laid out in contact with a connector element C, which enables an electrical contact with a selection device, not represented, Furthermore, numerous studies concern resistive random access memories in order to improve their reliability and their performances. One difficulty relates to the dispersion of certain electrical characteristics. An important dispersion of SET and RESET voltages and/or resistive states is in fact measured from one resistive random access memory to the next, but also cycle-to-cycle for a same resistive random access memory. One reason proposed to explain this dispersion concerns the difficulty of controlling the size and the position of the filament within the layer of active material,

SUMMARY

An aspect of the present invention aims to reduce the variability of the electrical characteristics of a resistive random access memory while relaxing the alignment constraints during the manufacture of the resistive random access memory.

A first aspect of the invention relates to a method for manufacturing a plurality of resistive random access memories, each resistive random access memory comprising a first electrode and a second electrode separated by a layer of active material, each resistive random access memory being initially in an insulating state and going from the insulating state to a conductive state by the application of a threshold voltage VFORMING between the first and second electrodes, the method for manufacturing comprising:
- a step of producing a plurality of connector elements extending substantially along a reference plane with a step $C_p$ along a first direction parallel to the reference plane, each connector element having a width $C_b$ measured along the first direction;
- a step of producing a plurality of first electrodes on the plurality of connector elements, without any alignment constraint between the plurality of connector elements and the plurality of first electrodes, the plurality of first electrodes having a step $E_p$ along the first direction, each first electrode having a first end surface and a second end surface, the second end surface having a width $E_b$ measured along the first direction and an area greater than the area of the first end surface; the step $E_p$ and the width $E_b$ being such that:

$0 < E_p - E_b \leq C_p - C_b$ and:

$Eb<Cp-Cb$ such that for each connector element of the plurality of connector elements, at least one first electrode of the plurality of first electrodes is in contact, via its second end surface, with said connector element, and each first electrode is only in contact, via its second end surface, with at the most one connector element;

a step of deposition of a layer of active material in contact, for each connector element, with the first end surface of at least one first electrode in contact with said connector element;

a step of producing, on the layer of active material, at least one second electrode in such a way that for each connector element, the second electrode is aligned with at least one first electrode in contact with said connector element, and the second electrode is separated from said at least one first electrode by the layer of active material.

"The second electrode is aligned with at least one first electrode in contact with said connector element" is taken to mean the fact that there exists at least one first plane perpendicular to the reference plane and passing through both the second electrode and the first end surface of at least one first electrode in contact with the connector element.

Thanks to the method for manufacturing a plurality of resistive random access memories according to the first aspect of the invention, a plurality of connector elements are produced with a step Cp along the first direction, each connector element having a width Cb measured along the first direction, and a plurality of first electrodes with a step Ep along the first direction, each first electrode having a second end surface of width Eb along the first direction. The width Eb of the second end surface of each first electrode is beneficially chosen such that: Eb<Cp−Cb. Thus, it is beneficially prevented that a same first electrode is in contact with two different connector elements, In other words, it is guaranteed that each first electrode will only be in contact with a single connector element at the most. It is possible that a first electrode is not in contact with any connector element. The step Ep and the width Eb are beneficially chosen in such a way that their difference is less than or equal to the difference of the step Cp and the width Cb of the connector element. Thus, it is guaranteed that there is always at least one first electrode in contact with each connector element, without any alignment constraint between the plurality of connector elements and the plurality of first electrodes. It is possible that several first electrodes are in contact with a same connector element, which is not detrimental to the subsequent correct operation of the resistive random access memory. In the case where a second electrode is aligned with several first electrodes in contact with a connector element, the first electrodes are in fact in competition with each other during the step of FORMING— during which the threshold voltage VFORMING is applied between the plurality of first electrodes on the one hand and the second electrode on the other hand. It is considered that the formation of a conductive filament starts, within the layer of active material, facing each of said first electrodes. The conductive filaments do not all form at the same speed. The first electrode facing which the conductive filament is entirely created the first thus determines the single functional memory point finally produced. As soon as the first conductive filament is created, the formation of other conductive filaments is inhibited. Furthermore, for each first electrode, the area of the first end surface is beneficially less than the area of the second end surface in order to be able to control, if need be, the size and the position of the filament within the layer of active material.

Apart from the characteristics that have just been described in the preceding paragraph, the method for manufacturing a resistive random access memory according to the first aspect of the invention may have one or more additional characteristics among the following, considered individually or according to any technically possible combinations thereof:

The step Ep may be chosen such that: 0<Ep<Cb. In this case it is guaranteed that there is always at least two first electrodes in contact with the connector element, without any alignment constraint between the connector element and the plurality of first electrodes.

Each connector element of the plurality of connector elements is in an embodiment a via or interconnection hole.

Each second electrode is in an embodiment an interconnection line.

The layer of active material is benficially deposited in contact with the first end surface of each first electrode. The deposition of the layer of active material is thus simplified.

According to a first embodiment, the step of producing the plurality of first electrodes comprises the following sub-steps:

a sub-step of deposition, on a layer of dielectric material comprising the plurality of connector elements, of a layer of a conductive material;

a sub-step of deposition, on the layer of the conductive material, of a resin layer;

a sub-step of structuring the resin layer to obtain a plurality of resin patterns with the step Ep along the first direction, each resin pattern comprising a first end surface and a second end surface having an area greater than the area of the first end surface, the second end surface being in contact with the layer of conductive material, the second end surface having the width Eb along the first direction;

a sub-step of anisotropic etching of the stack formed by the plurality of resin patterns and the layer of conductive material, with stoppage on the layer of dielectric material, to obtain the plurality of first electrodes;

a sub-step of deposition of a second layer of a dielectric material in such a way as to cover the plurality of first electrodes;

a sub-step of partial removal of the second layer of dielectric material in such a way as to release the first end surface of each first electrode.

This first embodiment has the benefit of enabling a simple and repeatable shape transfer, from the resin patterns to the conductive material, to obtain the plurality of first electrodes.

According to a second embodiment, the step of producing the plurality of first electrodes comprises the following sub-steps:

a sub-step of deposition, on a layer of dielectric material comprising the plurality of connector elements, of a layer of a conductive material;

a sub-step of producing, on the layer of conductive material, a plurality of masks with the step Ep along the first direction, each mask having a width along the first direction at least equal to the width Eb;

a sub-step of isotropic etching to obtain the plurality of first electrodes;

a sub-step of removal of the plurality of masks;

a sub-step of deposition of a second layer of a dielectric material in such a way as to cover the plurality of first electrodes;

a sub-step of partial removal of the second layer of dielectric material in such a way as to release the first end surface of each first electrode.

The sub-step of partial removal may be carried out by a chemical mechanical polishing technique.

Alternatively, the sub-step of partial removal may comprise:

a first sub-step of chemical mechanical polishing not emerging on the first end surface of each first electrode, and a second sub-step of etching in order to free the first end surface of each first electrode.

When the sub-step of partial removal is uniquely carried out by a chemical mechanical polishing technique, at least one dummy is beneficially produced beforehand in the conductive material in addition to the plurality of first electrodes, the dummy having a height, measured along a direction perpendicular to the reference plane, substantially equal to the height of each first electrode and having a first end surface larger than the first end surface of each first electrode in such a way as to form a stop surface during a chemical mechanical polishing.

A second aspect of the invention relates to a plurality of resistive random access memories obtainable by a method for manufacturing according to the first aspect of the invention, each memory of the plurality of resistive random access memories comprising a first electrode and a second electrode separated by a layer of active material, the plurality of resistive random access memories comprising:

a plurality of connector elements extending substantially along a reference plane with a step Cp along a first direction parallel to the reference plane, each connector element having a width Cb measured along the first direction;

a plurality of first electrodes with a step Ep along the first direction, each first electrode having a first end surface and a second end surface, the second end surface having a width Eb measured along the first direction and an area greater than the area of the first end surface;

each connector element being in contact with at least one first electrode and at least one first electrode not being in contact with any connector element.

A third aspect of the invention relates to a plurality of resistive random access memories obtainable by a method for manufacturing according to the first aspect of the invention, each memory of the plurality of resistive random access memories comprising a first electrode and a second electrode separated by a layer of active material, the plurality of resistive random access memories comprising:

a plurality of connector elements extending substantially along a reference plane with a step Cp along a first direction parallel to the reference plane, each connector element having a width Cb measured along the first direction;

a plurality of first electrodes with a step Ep along the first direction, each first electrode having a first end surface and a second end surface, the second end surface having a width Eb measured along the first direction and an area greater than the area of the first end surface;

each connector element being in contact with at least one first electrode and at least one connector element being in contact with several first electrodes.

A fourth aspect of the invention relates to a plurality of resistive random access memories obtainable by a method for manufacturing according to the first aspect of the invention, each memory of the plurality of resistive random access memories comprising a first electrode and a second electrode separated by a layer of active material, the plurality of resistive random access memories comprising:

a plurality of connector elements extending substantially along a reference plane with a step Cp along a first direction parallel to the reference plane, each connector element having a width Cb measured along the first direction;

a plurality of first electrodes with a step Ep along the first direction, each first electrode having a first end surface and a second end surface, the second end surface having a width Eb measured along the first direction and an area greater than the area of the first end surface;

each connector element being in contact with at least one first electrode, at least one first electrode not being in contact with any connector element, and at least one connector element being in contact with several first electrodes.

The invention and the different applications thereof will be better understood on reading the description that follows and by examining the figures that accompany it.

BRIEF DESCRIPTION OF THE FIGURES

The figures are presented for indicative purposes and in no way limit the invention.

FIG. 8b shows schematically a second top view in section of the plurality of resistive random access memories of FIG. 8a.

DETAILED DESCRIPTION

Unless stated otherwise, a same element appearing in the different figures has a single reference.

Figure 1:
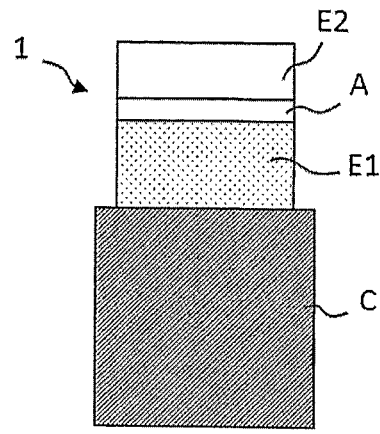
FIG. 1 shows a schematic representation of a resistive random access memory according to the prior art.

FIG. 1, which shows a schematic representation of a resistive random access memory 1 according to the prior art, has been described previously.

Figure 2:
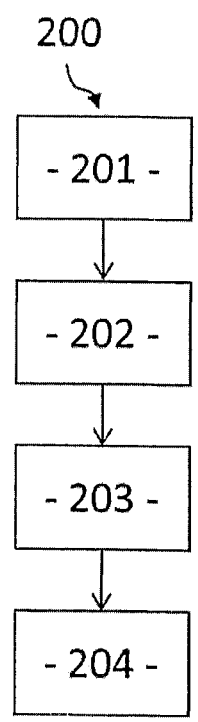
FIG. 2 shows a diagram of the steps of a method for manufacturing a plurality of resistive random access memories according to one aspect of the invention.
Figure 3A:
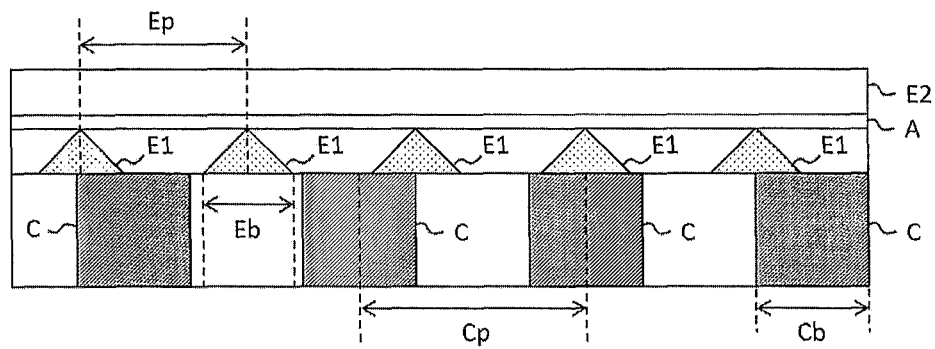
FIG. 3a shows schematically a sectional view of a first plurality of resistive random access memories obtained according to the method of FIG. 2.
Figure 3B:
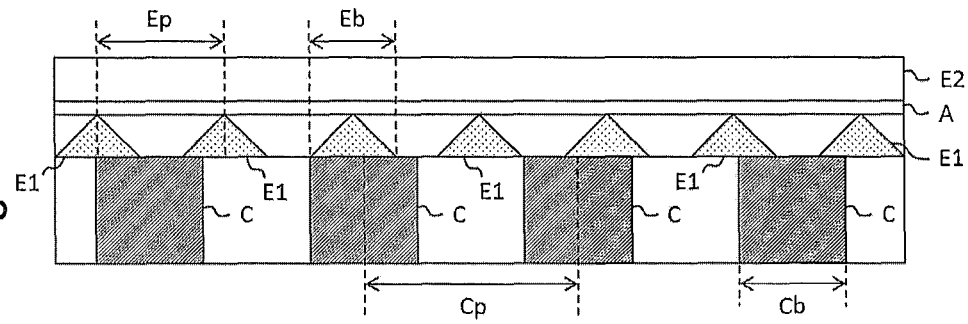
FIG. 3b shows schematically a sectional view of a second plurality of resistive random access memories obtained according to the method of FIG. 2.

FIG. 2 shows a diagram of the steps of a method 200, according to one aspect of the invention, for manufacturing a plurality of resistive random access memories. FIG. 3a shows schematically a sectional view of a first plurality of resistive random access memories obtained according to the method 200. FIG. 3b shows schematically a sectional view of a second plurality of resistive random access memories obtained according to the method 200. FIGS. 2, 3a and 3b are described jointly.

The method 200 for manufacturing a resistive random access memory comprises a step 201 according to which a plurality of connector elements C are produced extending substantially along a reference plane R with a step Cp along a first direction parallel to the reference plane R, each connector element C having a width Cb measured along the first direction. Each connector element C enables a pick-up of electrical contact and is typically produced within a layer of dielectric material. Each connector element C is, in an embodiment, a via or interconnection hole.

The method 200 for manufacturing a plurality of resistive random access memories next comprises a step 202 according to which a plurality of first electrodes E1 are produced with a step Ep along the first direction, each first electrode E1 having a first end surface ex1 and a second end surface ex2, the second end surface ex2 having a width Eb measured along the first direction and an area greater than the area of the first end surface ext; the step Ep and the width Eb being such that: 0<Ep−Eb<Cp−Cb, such that, for each connector element C, at least one first electrode E1 is in contact, via its second end surface ex2, with said connector element C.

Each first electrode E1 has a height Eh, measured along a direction perpendicular to the reference plane R between its first end surface ext and its second end surface ex2. For each first electrode E1, the ratio Eh/Eb of the height Eh over the width Eb is, in an embodiment, of the order of 2 and may for example be comprised between 1 and 3. A too high ratio Eh/Eb of the height Eh over the width Eb has for consequence mechanical instability, notably during polishing but also during etching. A too low ratio Eh/Eb of the height Eh over the width Eb has for consequence a too great variability of the first contact surface ex1 of each first electrode E1. The height Eh of each first electrode E1 is, in an embodiment, comprised between 50 nm and 300 nm. The width Eb of each first electrode E1 is thus, in an embodiment, comprised between 16 nm and 300 nm, and for example comprised between 25 nm and 150 nm.

Figure 4A:
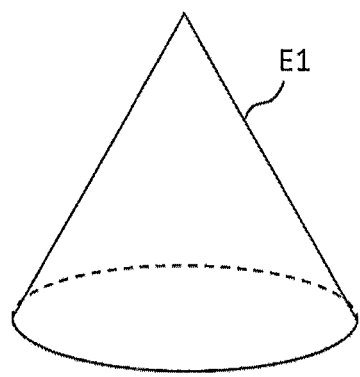
FIGS. 4a, 4b, 4c, 4d and 4e illustrate respectively first, second, third, fourth and fifth possible geometries of a first electrode of a resistive random access memory obtained according to the method of FIG. 2.
Figure 4B:
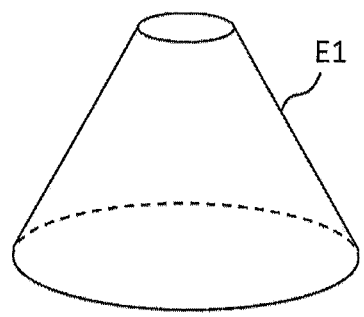
Figure 4C:
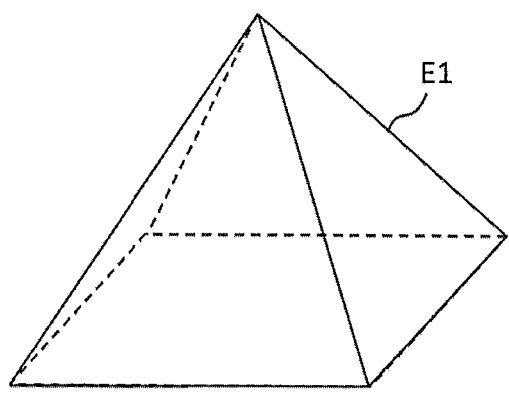
Figure 4D:
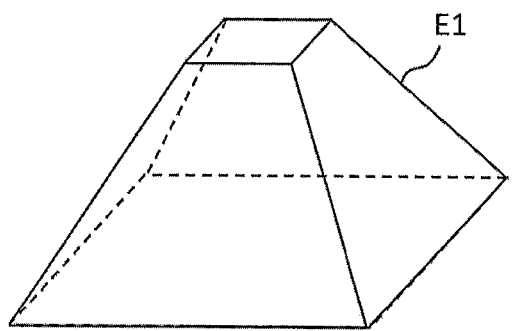
Figure 4E:
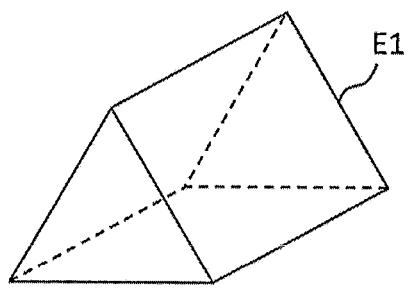

Each first electrode E1 may notably be of conical shape, of truncated shape, or of prism shape. FIG. 4a shows a first example of first cone shaped electrode E1; the first electrode E1 of FIG. 4a is more particularly a cone of revolution. FIG. 4c shows a second example of first cone shaped electrode E1; the first electrode E1 of FIG. 4c is more particularly a pyramid. FIG. 4b shows a first example of first truncated shaped electrode E1. FIG. 4d shows a second example of first truncated shaped electrode E1. FIG. 4e shows an example of first prism shaped electrode E1.

A first embodiment of step 202 of producing the plurality of first electrodes E1 is described hereafter in conjunction with FIGS. 5a, 5b, 5c and 5d. A second embodiment of step 202 of producing the plurality of first electrodes E1 is described hereafter in conjunction with FIGS. 6a, 6b, 6c and 6d.

The method 200 for manufacturing a plurality of resistive random access memories next comprises a step 203 according to which a layer of active material A is deposited in contact, for each connector element C, with the first end surface ex1 of at least one first electrode E1 in contact with said connector element C. The active material A is for example hafnium oxide $HfO_2$, or a nitride, or an oxide. The layer of active material A is beneficially deposited in contact with the first end surface ext of each first electrode E1. The deposition of the layer of active material A is thus simplified.

The method 200 for manufacturing a resistive random access memory next comprises a step 204 according to which, on the layer of active material A, at least one second electrode E2 is produced in such a way that for each connector element C, the second electrode E2 is aligned with at least one first electrode E1 in contact with said connector element C, and the second electrode is separated from said at least one first electrode E1 by the layer of active material A. The second electrode E2 is for example made of titanium Ti, titanium nitride TiN, tantalum Ta or tantalum nitride TaN. The second electrode E2 may notably be an alloy of titanium Ti and/or titanium nitride TiN and/or tantalum Ta and/or tantalum nitride TaN. The second electrode E2 may also be a multilayer comprising a layer of titanium Ti and/or a layer of titanium nitride TiN and/or a layer of tantalum Ta and/or a layer of tantalum nitride TaN and/or a layer of an alloy of the materials previously cited. The second electrode E2 is in an embodiment an interconnection line.

FIG. 3a shows in particular a first plurality of resistive random access memories obtained by the method 200. In this particular example, each connector element C is in contact with a single first electrode E1. It is possible that a first electrode E1 is not in contact with any connector element C. The width Eb of each first electrode E1 is less than the distance (Cp−Cb) that separates two consecutive connector elements C aligned along the first direction. Thus, a same first electrode E1 cannot be in contact with more than one connector element C.

FIG. 3b shows in particular a second plurality of resistive random access memories obtained by the method 200. In this particular example, each connector element C is in contact with one or two first electrodes E1. It is possible that a first electrode E1 is not in contact with any connector element C. The width Eb of each first electrode E1 is less than the distance (Cp−Cb) that separates two consecutive connector elements C aligned along the first direction.

The first embodiment of step 202 of producing the plurality of first electrodes E1 is now described, in conjunction with FIGS. 5a, 5b, 5c and 5d. Step 202 of producing the plurality of first electrodes E1 comprises, according to the first embodiment, a first sub-step of deposition, on a layer of dielectric material comprising the connector element C, of a layer of a conductive material. The layer of conductive material has a thickness, measured along a direction perpendicular to the reference plane R, greater than or equal to the height Eh desired for each first electrode E1. The layer of the conductive material, in an embodiment, has a thickness comprised between 50 nm and 300 nm. The conductive material may for example be titanium nitride TiN, titanium Ti, tantalum nitride TaN or tantalum Ta.

Figure 5A:
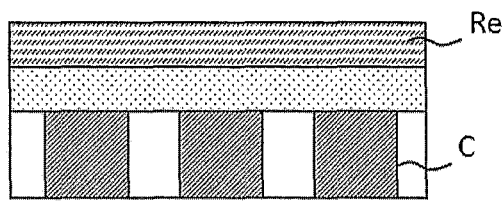
FIGS. 5a, 5b, 5c and 5d show sub-steps of a step of producing a plurality of first electrodes of the method of FIG. 2, according to a first embodiment.

Step 202 of producing the plurality of first electrodes E1 next comprises, according to the first embodiment, a second sub-step of deposition, on the layer of the conductive material, of a layer of resin Re. This second sub-step is illustrated in FIG. 5a.

Figure 5B:
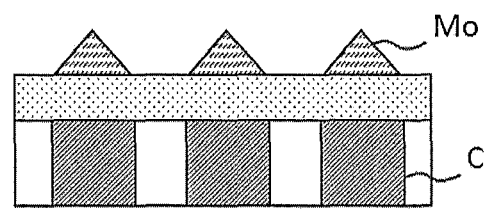

Step 202 of producing the plurality of first electrodes E1 next comprises, according to the first embodiment, a third sub-step of structuring the resin layer to obtain a plurality of resin patterns Mo with the step Ep along the first direction, each resin pattern Mo comprising a first end surface and a second end surface having an area greater than the area of the first end surface, the second end surface being in contact with the layer of conductive material, the second end surface having the width Eb along the first direction. The structuring of the resin layer may be carried out by a nano-printing or nano-moulding technique. The structuring of the resin layer may alternatively be carried out by a step of conventional lithography. In this alternative, the first embodiment of the invention makes it possible to get away from the use of the most aggressive lithography techniques while finally obtaining a memory zone, between the first and second electrodes of each resistive random access memory, of very reduced dimensions. A step of hardening of the resin may be provided. This third sub-step is illustrated in FIG. 5b.

Figure 5C:
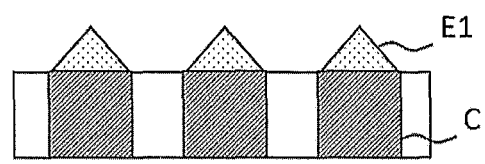

Step 202 of producing the plurality of first electrodes E1 next comprises, according to the first embodiment, a fourth sub-step of anisotropic etching of the stack formed by the plurality of resin patterns and the layer of conductive material, with stoppage on the layer of dielectric material, to obtain the plurality of first electrodes E1. Having previously carried out a step of hardening of the resin makes it possible to minimise the rate of etching of said patterns. The objective is to achieve an etching selectivity substantially equal to 1 between the conductive material and the resin, or in other words to manage to etch the conductive material and the resin substantially at the same rate. If the selectivity of etching between the conductive material and the resin is greater than 1, that is to say if the conductive material is etched faster than the resin, in an embodiment, it is chosen beforehand to deposit a thickness of the layer of resin Re, measured along a direction perpendicular to the reference plane R, less than the height Eh desired for each first electrode E1. In other words, it is provided that the height of each structured pattern Mo is less than the height Eh of the first electrode E1 that it serves to realise by transfer. If on the other hand the etching selectivity between the conductive material and the resin is less than 1, that is to say if the conductive material is etched less quickly than the resin, it is, in an embodiment, chosen beforehand to deposit a thickness of the layer of resin Re, measured along a direction perpendicular to the reference plane R, greater than the height Eh desired for each first electrode E1. In other words, it is provided that the height of each structured pattern Mo is greater than the height Eh of the first electrode E1 that it serves to realise by transfer. This thus enables an optimum transfer of the shape of each resin pattern Mo in the conductive material, to obtain the plurality of first electrodes E1 made of conductive material. The anisotropic etching may be carried out by means of a RIE (reactive ion etching) technique of chlorinated type, with for example boron trichloride $BCl_3$ or dichlorine $Cl_2$. This fourth sub-step is illustrated in FIG. 5c.

Figure 5D:
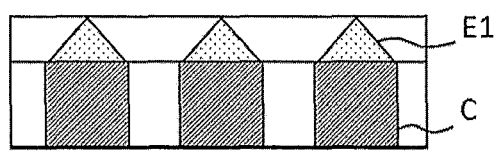

Step 202 of producing the plurality of first electrodes E1 next comprises, according to the first embodiment, a fifth sub-step of deposition of a second layer of a dielectric material in such a way as to cover the plurality of first electrodes E1, then a sixth sub-step of partial removal of the second layer of dielectric material in such a way as to release the first end surface ex1 of each first electrode E1. This sixth sub-step is illustrated in FIG. 5d.

The first embodiment that has just been described has the benefit of enabling a simple and repeatable shape transfer, from the resin patterns to the conductive material, to obtain the plurality of first electrodes.

The second embodiment of step 202 of producing the plurality of first electrodes E1 is now described, in conjunction with FIGS. 6a, 6b, 6c, and 6d. Step 202 of producing the plurality of first electrodes E1 comprises, according to the second embodiment, the first sub-step of deposition, on a layer of dielectric material comprising the connector element C, of a layer of a conductive material. This first sub-step has been described previously, it is common to the first and second embodiments.

Figure 6A:
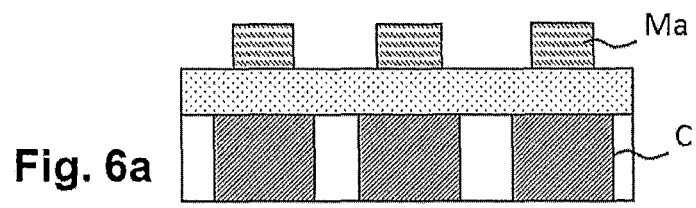
FIGS. 6a, 6b, 6c and 6d show sub-steps of a step of producing a plurality of first electrodes of the method of FIG. 2, according to a second embodiment.

Step 202 of producing the plurality of first electrodes E1 next comprises, according to the second embodiment, a second sub-step of producing a plurality of masks Ma. This second sub-step is illustrated in FIG. 6a. The plurality of masks Ma is for example obtained by depositing a layer of a mask material on the layer of conductive material, then by carrying out a conventional lithography. In this example, the second embodiment of the invention beneficially makes it possible to get away from the use of the most aggressive lithography techniques while finally obtaining a memory zone, between the first and second electrodes of each resistive random access memory, of very reduced dimensions.

Figure 6B:
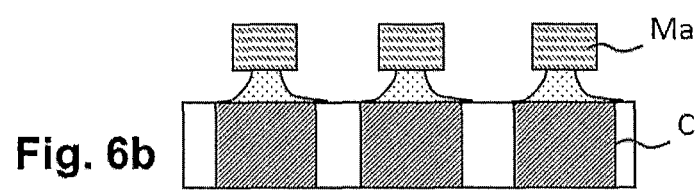
Figure 6C:
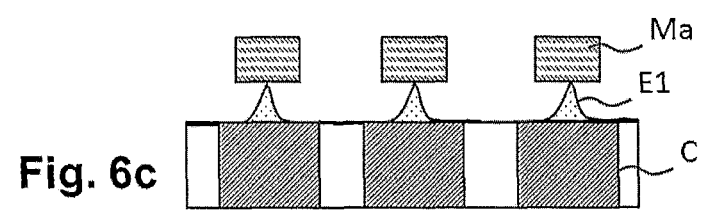

Step 202 of producing the plurality of first electrodes E1 next comprises, according to the second embodiment, a third sub-step of isotropic etching, to obtain the plurality of first electrodes E1. This third sub-step is illustrated in FIGS. 6b and 6c.

Figure 6D:
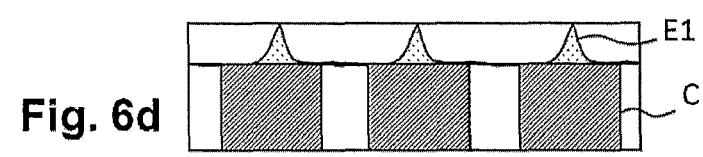

Step 202 of producing the plurality of first electrodes E1 next comprises, according to the second embodiment, a fourth sub-step of removal of the plurality of masks Ma, then a fifth sub-step of deposition of a second layer of a dielectric material in such a way as to cover the plurality of first electrodes E1, followed by a sixth sub-step of partial removal of the second layer of dielectric material in such a way as to release the first end surface ex1 of each first electrode E1. This sixth sub-step is illustrated in FIG. 6d. The fifth and sixth sub-steps are common to the first and second embodiments.

Figure 7:
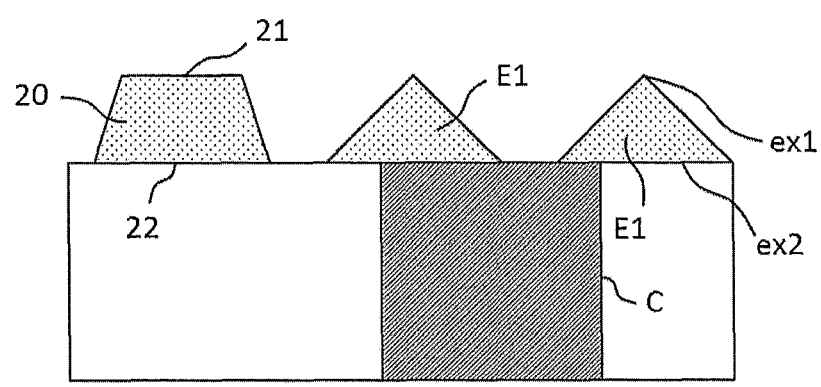
FIG. 7 shows an example of dummy that can be used during the method of FIG. 2.

The sixth sub-step of partial removal of the second layer of dielectric material, common to the first and second embodiments, may be carried out in different ways. A first possibility is to use a chemical mechanical polishing technique in order to emerge on the first end surface ex1 of each first electrode E1. One or more dummies may have been produced in the conductive material, in addition to the plurality of first electrodes. FIG. 7 shows for example a dummy 20 comprising a first end surface 21 and a second end surface 22. The dummy 20 has a height, measured along a direction perpendicular to the reference plane R, substantially equal to the height Eh of each first electrode E1. The first end surface 21 of the dummy 20 is larger than the first end surface ex1 of each first electrode E1 and forms an efficient stop surface during chemical mechanical polishing. Thus, the first end surface ex1 of each first electrode is protected, which is only slightly polished or not at all polished during chemical mechanical polishing. For each first electrode E1 a first end surface ex1 is obtained that is beneficially the smallest possible, in order to control the size and the position of the filament within the layer of active material. The dummy or dummies may for example be of cylindrical or truncated shape, as represented in FIG. 7.

A second possibility is to carry out a first sub-step of chemical mechanical polishing in order to obtain a flat surface of the layer of second dielectric material, but without emerging on the first end surface ex1 of each first electrode E1. Next a second sub-step of dry and/or wet etching is carried out in order to free the first end surface ex1 of each first electrode E1. The etching method used is selective vis-à-vis the conductive material of the first electrodes E1, in order that the first electrodes E1 are not etched, or very little etched, during this second sub-step. In this way, for each first electrode E1, a first end surface ext is thus obtained that is beneficially the smallest possible, in order to control the size and the position of the filament within the layer of active material.

Figure 8A:
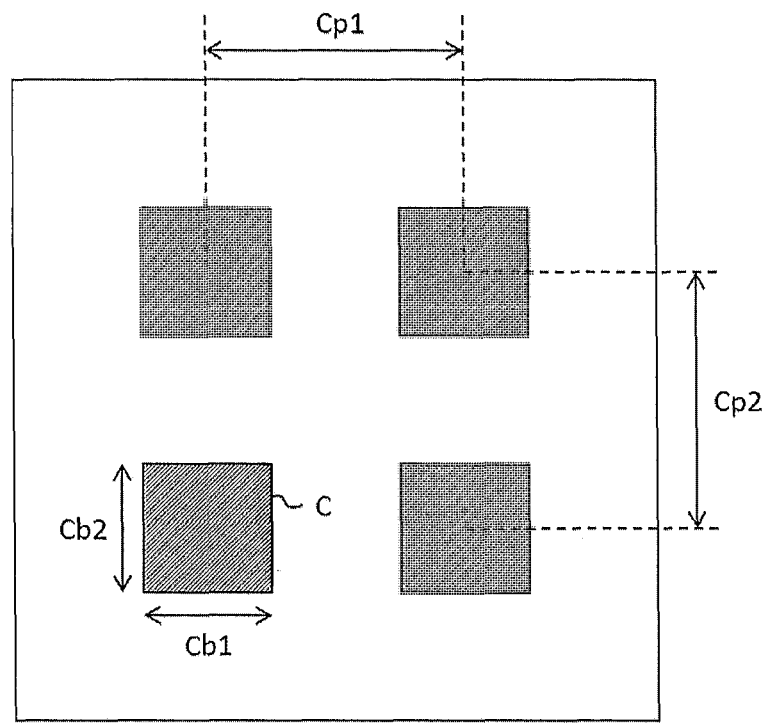
FIG. 8a shows schematically a first top view in section of a plurality of resistive random access memories obtained by the method of FIG. 2.
Figure 8B:
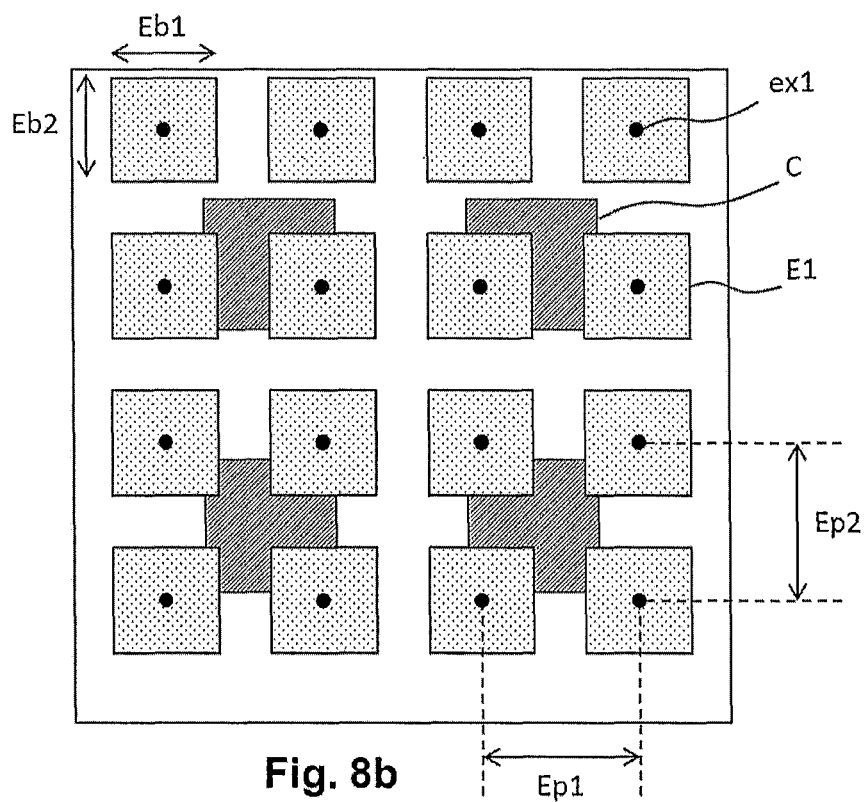

FIG. 8a shows schematically a first top view in section of a plurality of resistive random access memories obtained by the method 200, FIG. 8b shows schematically a second top view in section of the plurality of resistive random access memories of FIG. 8a. FIGS. 8a and 8b are described jointly. A plurality of connector elements C is arranged regularly with a step Cp1 along the first direction and a step Cp2 along a second direction parallel to the first reference plane R. The second direction is distinct from the first direction. The second direction is beneficially substantially perpendicular to the first direction. Each connector element C has a width Cb1 measured along the first direction and a length Cb2 measured along the second direction. A plurality of first electrodes E1 is arranged regularly with a step Epi along the first direction and a step Ep2 along the second direction. Each first electrode E1 has a width Eb1 along the first direction and a length Eb2 along the second direction. Along the first direction, the steps Ep1 and Cp1 and the widths Eb1 and Cb1 are such that:

$$0<Ep1-Eb1 \leq Cp1-Cb1$$

and, in an embodiment, such that:

$$Eb1<Cp1-Cb1$$

Similarly, along the second direction, the steps Ep2 and Cp2 and the lengths Eb2 and Cb2 are such that:

$$0<Ep2-Eb2 \leq Cp2-Cb2$$

And, in an embodiment, such that:

$$Eb2<Cp2-Cb2$$

Figure 9:
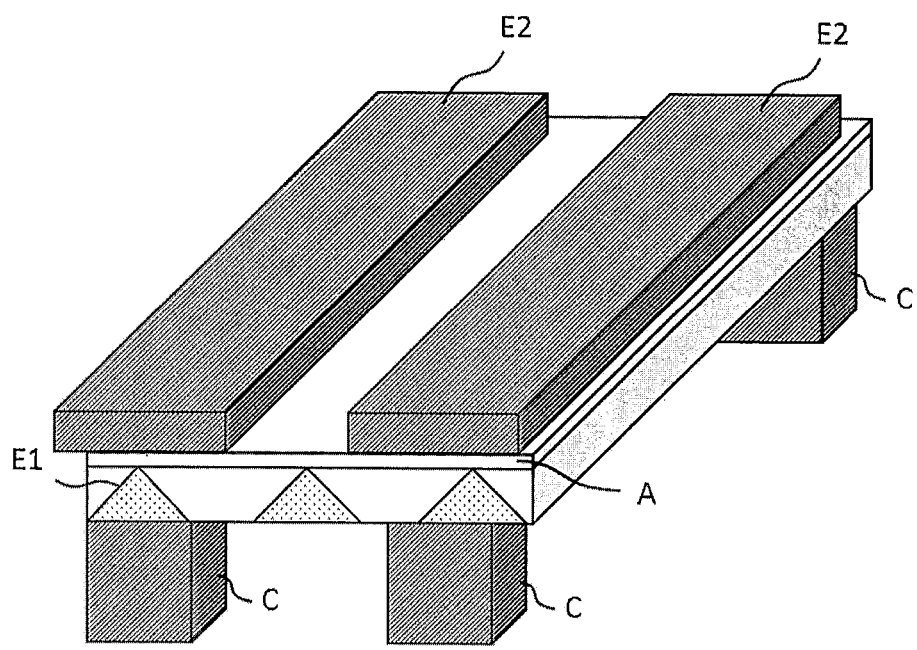
FIG. 9 shows schematically a perspective view of a plurality of resistive random access memories obtained by the method of FIG. 2.

FIG. 9 shows schematically a perspective view of a plurality of resistive random access memories obtained by the method for manufacturing 200 a plurality of resistive random access memories according to one aspect of the invention. In the example of FIG. 9, each connector element C is a via or interconnection hole, specific to each resistive random access memory, and each second electrode E2 is an interconnection line, common to several resistive random access memories.

The invention claimed is:

1. A method for manufacturing a plurality of resistive random access memories, each resistive random access memory comprising a first electrode and a second electrode separated by a layer of active material, each resistive random access memory being initially in an insulating state and going from the insulating state to a conductive state by the application of a threshold voltage VFORMING between the first and second electrodes, the method for manufacturing comprising:
    a step of producing a plurality of connector elements extending substantially along a reference plane with a step Cp along a first direction parallel to the reference plane, each connector element having a width Cb measured along the first direction;
    a step of producing a plurality of first electrodes on the plurality of connector elements, without any alignment constraint between the plurality of connector elements and the plurality of first electrodes, the plurality of first electrodes having a step Ep defined between two adjacent first electrodes of the plurality of first electrodes along the first direction, each first electrode having a first end surface and a second end surface, the second end surface having a width Eb measured along the first direction and an area greater than the area of the first end surface; the step Ep and the width Eb being such that:

$$0<Ep-Eb \leq Cp-Cb$$

and:

$$Eb<Cp-Cb$$

such that, for each connector element of the plurality of connector elements, at least one first electrode of the plurality of first electrodes is in contact, via its second end surface, with said connector element, and each first electrode is only in contact, via its second end surface, with at the most one connector element;
    a step of deposition of a layer of active material in contact, for each connector element, with the first end surface of at least one first electrode in contact with said connector element; and
    a step of producing, on the layer of active material, at least one second electrode in such a way that for each connector element, the second electrode is aligned with at least one first electrode in contact with said connector element, and the second electrode is separated from said at least one first electrode by the layer of active material.

2. The method for manufacturing a plurality of resistive random access memories according to claim 1, wherein the step Ep is chosen such that: 0<Ep<Cb.

3. The method according to claim 1, wherein the step of producing the plurality of first electrodes comprises the following sub-steps:
    a sub-step of deposition, on a layer of dielectric material comprising the plurality of connector elements, of a layer of a conductive material;
    a sub-step of deposition, on the layer of the conductive material, of a resin layer;
    a sub-step of structuring the resin layer to obtain a plurality of resin patterns with the step Ep along the first direction, each resin pattern comprising a first end surface and a second end surface having an area greater than the area of the first end surface, the second end surface being in contact with the layer of conductive material, the second end surface having the width Eb along the first direction;
    a sub-step of anisotropic etching of the stack formed by the plurality of resin patterns and the layer of conductive material, with stoppage on the layer of dielectric material, to obtain the plurality of first electrodes;
    a sub-step of deposition of a second layer of a dielectric material in such a way as to cover the plurality of first electrodes;
    a sub-step of partial removal of the second layer of dielectric material in such a way as to release the first end surface of each first electrode.

4. The method according to claim 1, wherein the step of producing the plurality of first electrodes comprises the following sub-steps:
    a sub-step of deposition, on a layer of dielectric material comprising the plurality of connector elements, of a layer of a conductive material;
    a sub-step of producing, on the layer of conductive material, a plurality of masks with the step Ep along the first direction, each mask having a width along the first direction at least equal to the width Eb;
    a sub-step of isotropic etching to obtain the plurality of first electrodes;
    a sub-step of removal of the plurality of masks;

a sub-step of deposition of a second layer of a dielectric material in such a way as to cover the plurality of first electrodes;

a sub-step of partial removal of the second layer of dielectric material in such a way as to release the first end surface of each first electrode.

5. The method according to claim 4, wherein the sub-step of partial removal is carried out by a chemical mechanical polishing technique.

6. The method according to claim 5, wherein at least one dummy has been produced beforehand in the conductive material in addition to the plurality of first electrodes, the dummy having a height, measured along a direction perpendicular to the reference plane, substantially equal to the height of each first electrode and having a first end surface larger than the first end surface of each first electrode in such a way as to form a stop surface during a chemical mechanical polishing.

7. The method according to claim 4, wherein the sub-step of partial removal comprises:

a first sub-step of chemical mechanical polishing not emerging on the first end surface of each first electrode, and a second sub-step of etching in order to free the first end surface of each first electrode.

* * * * *